United States Patent [19]
Lee

[11] Patent Number: 5,929,661
[45] Date of Patent: *Jul. 27, 1999

[54] HIGH SPEED VOLTAGE COMPARATOR WITH MATCHING CURRENT SOURCES USING CURRENT DIFFERENCE AMPLIFIERS

[75] Inventor: Johnny Chuang-Li Lee, Santa Clara, Calif.

[73] Assignee: National Semiconductor Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/771,327

[22] Filed: Dec. 16, 1996

[51] Int. Cl.$^6$ .............................. H03K 5/153; H03K 5/08
[52] U.S. Cl. .............................. 327/63; 327/67; 327/362; 327/77; 327/89; 327/65
[58] Field of Search .................................. 327/63, 52, 53, 327/54, 65, 66, 67, 362, 50, 77, 89

[56] References Cited

U.S. PATENT DOCUMENTS

| | | | |
|---|---|---|---|
| 5,289,054 | 2/1994 | Lucas | 327/362 |
| 5,583,425 | 12/1996 | Rapp et al. | 327/73 |
| 5,621,340 | 4/1997 | Lee et al. | 327/362 |

OTHER PUBLICATIONS

A. Rodriguez–Vazquez et al., "High Resolution CMOS Current Comparators: Design and Applications to Current–Mode Function Generation" *Analog Integrated Circuits and Signal Processing*, 7, pp. 149–165 (1995).

*Primary Examiner*—Dinh Le
*Attorney, Agent, or Firm*—Limbach & Limbach L.L.P.

[57] ABSTRACT

A voltage comparator for comparing a first input voltage to a second input voltage includes a first transistor having a gate to which the first input voltage is applied and a second transistor having a gate to which the second input voltage is applied. Third and fourth transistors, coupled to the first and second transistors respectively, each conduct a first current in response to a first reference voltage being applied to a gate of each transistor. A fifth transistor is coupled to the first and second transistors and has a gate to which a second reference voltage is applied to maintain a sum of currents conducted by the first and second transistors equal to a second current. A reference generation circuit is coupled to the third, fourth and fifth transistors and is configured to generate the first and second reference voltages having magnitudes which set the second current equal to twice the first current. A first current difference amplifier has an input coupled to the first and third transistors and is configured to generate one of a first, second and third output voltage levels in response to a sourcing, zero or sinking current, respectively, being received at its input.

6 Claims, 5 Drawing Sheets

HIGH SPEED VOLTAGE COMPARATOR WITH MATCHING CURRENT SOURCES USING CURRENT DIFFERENCE AMPLIFIERS

BACKGROUND OF THE INVENTION

1. Field of the Invention

The present invention relates to voltage comparators, and more particularly, to a high speed voltage comparator having matched current sources using current difference amplifiers.

2. Description of the Related Art

A voltage comparator is a device used for comparing voltages. Voltage comparators have many applications, one example of which is in analog-to-digital (A/D) converters. In an A/D converter, each voltage comparator typically compares only two voltages. One voltage is the analog input voltage which is received by each comparator, and the other voltage is a fixed voltage which is different for each comparator. The outputs of the converters generate logic "highs" or logic "lows" depending upon which of their two input voltages is larger. In this way, the analog voltage is converted into digital units for digital computer processing.

Referring to FIGS. 1A and 1B there is illustrated a current difference amplifier 20 which is described in the paper entitled "High Resolution CMOS Current Comparators: Design and Applications to Current-Mode Function Generation", Analog Integrated Circuits and Signal Processing, 7, 149–165 (1995). The current difference amplifier 20 is basically a feedback loop formed by an inverter 22 and a non-inverting buffer 24. Transistors M1, M2 form the non-inverting buffer 24. When the input current $i_{IN}$=0, transistors M1, M2 have the transfer function 26 shown in FIG. 1C. It should be noted that node $V_{IN}$ is actually the output of the non-inverting buffer 24 and that node $V_{OUT}$ is the input to the non-inverting buffer 24. Transistors M3, M4 form the inverter 22 which has the transfer function 28, also shown in FIG. 1C.

The interception point P of the transfer functions 26, 28 is the quiescent voltage level $V_Q$ at which the difference amplifier 20 operates when $i_{IN}$=0. When enough current is sourced into the input node $V_{IN}$, i.e., $i_{IN}$>0 (a "sourcing current"), transistor M2 turns on harder and the output voltage $V_{OUT}$ goes to zero, i.e., the operating point moves to point B on transfer function 28. When current is sinked from the input node $V_{IN}$, i.e., $i_{IN}$<0 (a "sinking current"), transistor M1 turns on harder and the output voltage $V_{OUT}$ goes to $V_{CC}$, i.e., the operating point moves to point A on transfer function 28. As is shown in FIG. 1C, the input voltage $V_{IN}$ changes very little and is biased near the inverter 22's switching point. The output voltage $V_{OUT}$, however, swings from rail to rail depending on the input current $i_{IN}$'s polarity and magnitude.

The current difference amplifier 20 was used in a current comparator which is described in the above-identified paper. However, there is a need for a high speed voltage comparator.

SUMMARY OF THE INVENTION

The present invention provides a voltage comparator which includes an input comparator configured to compare a first input voltage to a second input voltage and to generate an output current in response thereto. The output current is a sourcing current if the first input voltage is greater than the second input voltage, a zero current if the first input voltage is equal to the second input voltage, and a sinking current if the first input voltage is less than the second input voltage. A first current difference amplifier is coupled to the input comparator and configured to generate a first output voltage level in response to the output current being a sourcing current, a second output voltage in response to the output current being a zero current, and a third output voltage in response to the output current being a sinking current.

The present invention also provides a voltage comparator for comparing a first input voltage to a second input voltage. The voltage comparator includes an input comparator having first and second parallel conduction paths which are coupled to first and second nodes, respectively. The input comparator is configured to provide each of the first and second nodes with a first current in response to a first reference voltage, to maintain a sum of currents conducted by the first and second conduction paths equal to a second current in response to a second reference voltage, and to generate an output current to maintain the sum of currents conducted by the first and second conduction paths equal to the second current in response to the first and second input voltages not being equal. A reference generation circuit is coupled to the input comparator and is configured to generate the first and second reference voltages having magnitudes which set the second current equal to twice the first current. A first current difference amplifier has an input coupled to the input comparator and is configured to generate one of a first, second and third output voltage levels in response to the output current being a sourcing, zero or sinking current, respectively.

The present invention also provides a voltage comparator for comparing a first input voltage to a second input voltage. A first transistor has a gate to which the first input voltage is applied, and a second transistor has a gate to which the second input voltage is applied. A first current circuit is coupled to the first and second transistors and configured to provide a first current to each of the first and second transistors in response to a first reference voltage. A second current circuit is coupled to the first and second transistors and configured to maintain a sum of currents conducted by the first and second transistors equal to a second current in response to a second reference voltage. A reference generation circuit is coupled to the first and second current circuits and configured to generate the first and second reference voltages having magnitudes which set the second current equal to twice the first current. A first current difference amplifier has an input coupled to the first transistor and is configured to generate one of a first, second and third output voltage levels in response to a sourcing, zero or sinking current, respectively, being received at its input.

The present invention also provides a voltage comparator for comparing a first input voltage to a second input voltage. The voltage comparator includes an input comparator having first and second parallel conduction paths which are coupled to first and second nodes, respectively. The input comparator is configured to provide each of the first and second nodes with a first current in response to a first reference voltage, to maintain a sum of currents conducted by the first and second conduction paths equal to a second current in response to a second reference voltage, and to generate an output current to maintain the sum of currents conducted by the first and second conduction paths equal to the second current in response to the first and second input voltages not being equal. A reference generation circuit is coupled to the input comparator and configured to generate the first and second reference voltages having magnitudes which set the second current approximately equal to twice the first current. A first current difference amplifier has an input coupled to the input comparator and configured to generate one of a first, second and third output voltage levels in response to the output current being a sourcing, zero or sinking current, respectively. A correction circuit is coupled to the reference generation circuit and configured to monitor the first and second reference voltages and to generate and provide a correction current to the reference generation circuit which adjusts the magnitude of the first and second reference voltages to continually maintain the second current equal to twice the first current.

The present invention also provides a method of comparing a first input voltage to a second input voltage. The method includes the steps of: applying the first input voltage to a gate of a first transistor; applying the second input voltage to a gate of a second transistor; generating a first current in a first node coupled to the first transistor; generating the first current in a second node coupled to the second transistor; maintaining a sum of currents conducted by the first and second transistors equal to a second current; maintaining the second current equal to twice the first current; generating an output current to maintain the sum of currents conducted by the first and second transistors equal to the second current in response to the first and second input voltages not being equal; and altering an operating point of a current difference amplifier in response to the output current.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 2:
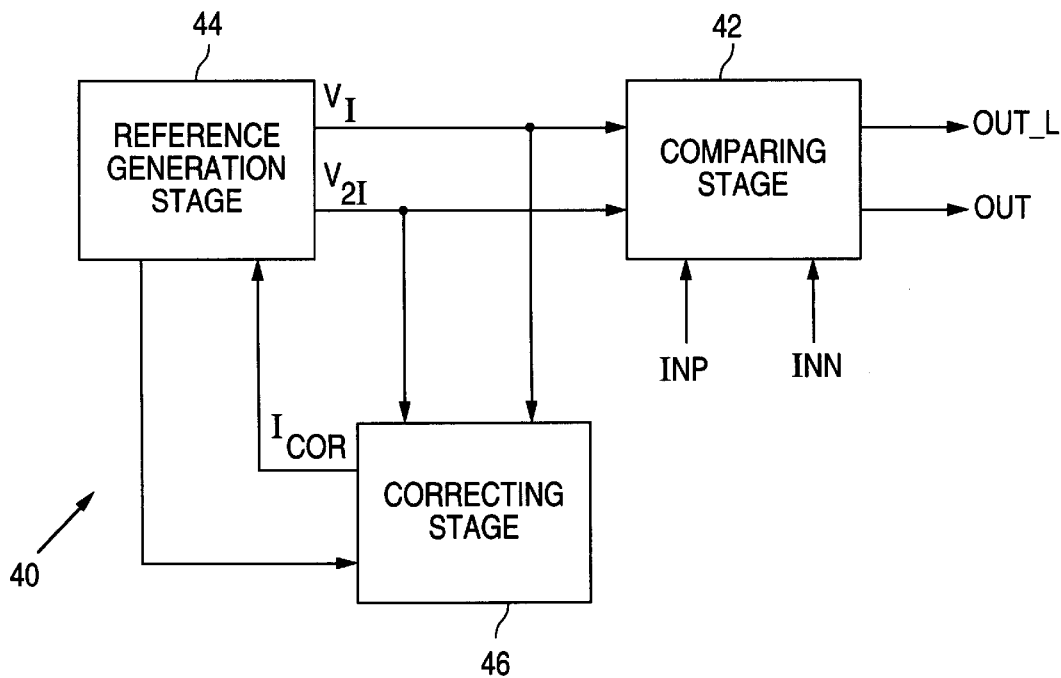
FIG. 2 is a block diagram illustrating a voltage comparator in accordance with the present invention.

Referring to FIG. 2, there is illustrated a voltage comparator 40 in accordance with the present invention. The voltage comparator 40 is a high speed comparator which utilizes the current difference amplifier 20 discussed above. Current difference amplifiers are also used to construct matched up/down current sources for minimizing current offsets.

In general, the voltage comparator 40 includes three stages: a comparing stage 42, a reference generation stage 44, and a correcting stage 46. The comparing stage 42 compares the two input voltages INP and INN. As long as INP and INN are equal, the outputs OUT and OUT_L will both be at the quiescent voltage level $V_Q$, i.e., neither high or low. However, if the input voltage INP is greater than the input voltage INN, then the output OUT will go high and the output OUT_L will go low; if the input voltage INP is less than the input voltage INN, then the output OUT will go low and the output OUT_L will go high. The output OUT_L is simply the compliment of the output OUT. The reference generation stage 44 generates reference voltages $V_I$ and $V_{2I}$ which, as will be discussed below, are used by the comparing stage 42. The correcting stage 46 includes a feedback loop which ensures that the reference voltages $V_I$ and $V_{2I}$ are generated accurately.

Figure 3:
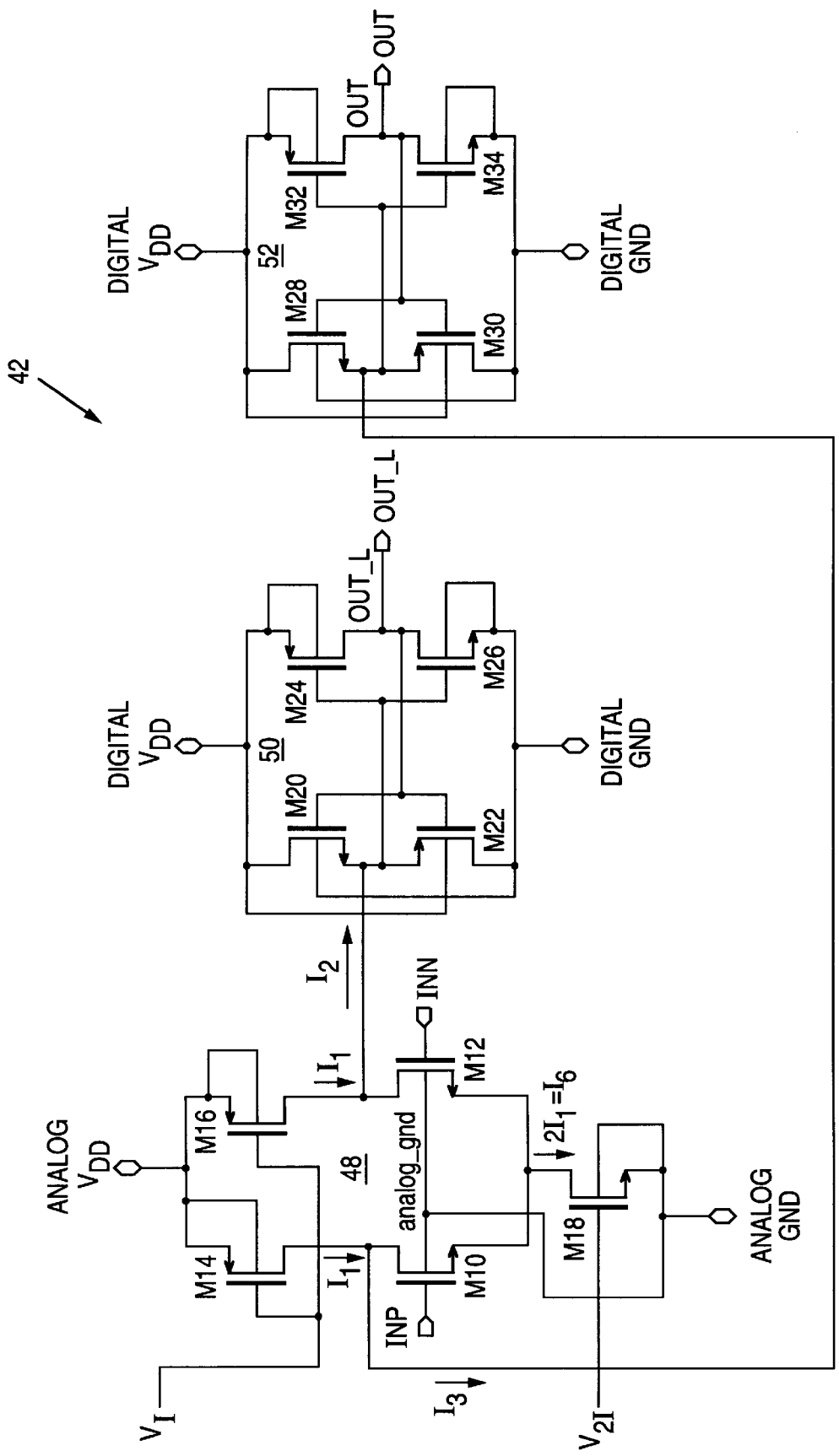
FIG. 3 is a schematic diagram illustrating the comparing stage of the voltage comparator shown in FIG. 2.

Referring to FIG. 3, the comparing stage 42 includes a comparator 48 (i.e., a differential pair) and two current difference amplifiers 50, 52, connected substantially as shown. The current difference amplifiers 50, 52 operate substantially the same as the current difference amplifier 20 described above. The comparator 48 is used to switch the currents $I_2$, $I_3$ into and out of the current difference amplifier 50, 52. The comparator 48 receives the input voltage INP at the gate of n-channel transistor M10 and the input voltage INN at the gate of n-channel transistor M12. Transistors M10, M12 form parallel conduction paths with the current conducted by each flowing into transistor M18. As will be explained below, the reference voltage $V_I$ causes a current $I_1$ to be conducted by each of the p-channel transistors M14, M16, and the reference voltage $V_{2I}$ causes a current $I_6$ which is equal to $2I_1$, i.e., twice the current $I_1$, to be conducted by the n-channel transistor M18.

When the input voltages INP and INN are equal (i.e., INP=INN), transistors M10, M12 each conduct the current $I_1$ and the currents $I_2$ and $I_3$ are both equal to zero. Thus, no current is being sourced to or sunk from either of the difference amplifiers 50, 52. Similar to the difference amplifier 20 described above, when the input currents $I_2$, $I_3$ of the difference amplifiers 50, 52 are zero, the output voltages OUT_L and OUT are equal to the quiescent voltage level $V_Q$.

When the input voltage INP is greater than the input voltage INN (i.e., INP>INN), the gate-source voltage $V_{GS}$ of transistor M10 is greater than the gate-source voltage $V_{GS}$ of transistor M12. This causes transistor M10 to conduct more current than transistor M12. Transistor M10 will conduct more than current $I_1$ and may conduct as much as $2I_1$. Because transistor M18 will continue to conduct current $I_6=2I_1$, some of the current $I_1$ conducted by transistor M16 will be diverted to current $I_2$. This follows because the sum of the currents conducted by transistors M10, M12 will be maintained equal to current $I_6$.

Because current $I_2$ is sourced into differential amplifier 50, i.e., $I_2>0$ ("sourcing current"), the input current of difference amplifier 50 is greater than zero. Similar to the difference amplifier 20 described above, when the input current $I_2$ is greater than zero, the output voltage OUT_L of the difference amplifier 50 will go low, i.e., to GND. In addition, in order for transistor M10 to conduct more than current $I_1$, additional current is sinked from difference amplifier 52, i.e., current $I_3<0$ ("sinking current"). Similar to the difference amplifier 20 described above, when the input current $I_3$ is less than zero, the output voltage OUT of difference amplifier 52 will go high, i.e., to $V_{DD}$. Thus, when INP>INN, OUT goes high and OUT_L goes low. It should be noted that currents $I_2$ and $I_3$ have equal magnitudes but opposite directions.

When the input voltage INP is less than the input voltage INN (i.e., INP<INN), the gate-source voltage $V_{GS}$ of transistor M12 is greater than the gate-source voltage $V_{GS}$ of transistor M10. This causes transistor M12 to conduct more current than transistor M10. Again, however, the sum of the currents conducted by transistors M10, M12 will be maintained equal to current $I_6$. In this scenario, current $I_2$ is sinked from difference amplifier 50, i.e., $I_2<0$, and current $I_3$ is sourced into difference amplifier 52, i.e., $I_3>0$. Because the input current $I_2$ is less than zero, the output voltage OUT_L of the difference amplifier 50 goes high, and because the input current $I_3$ is greater than zero, the output voltage OUT of difference amplifier 52 goes low. Thus, when INP<INN, OUT goes low and OUT_L goes high.

Figure 4:
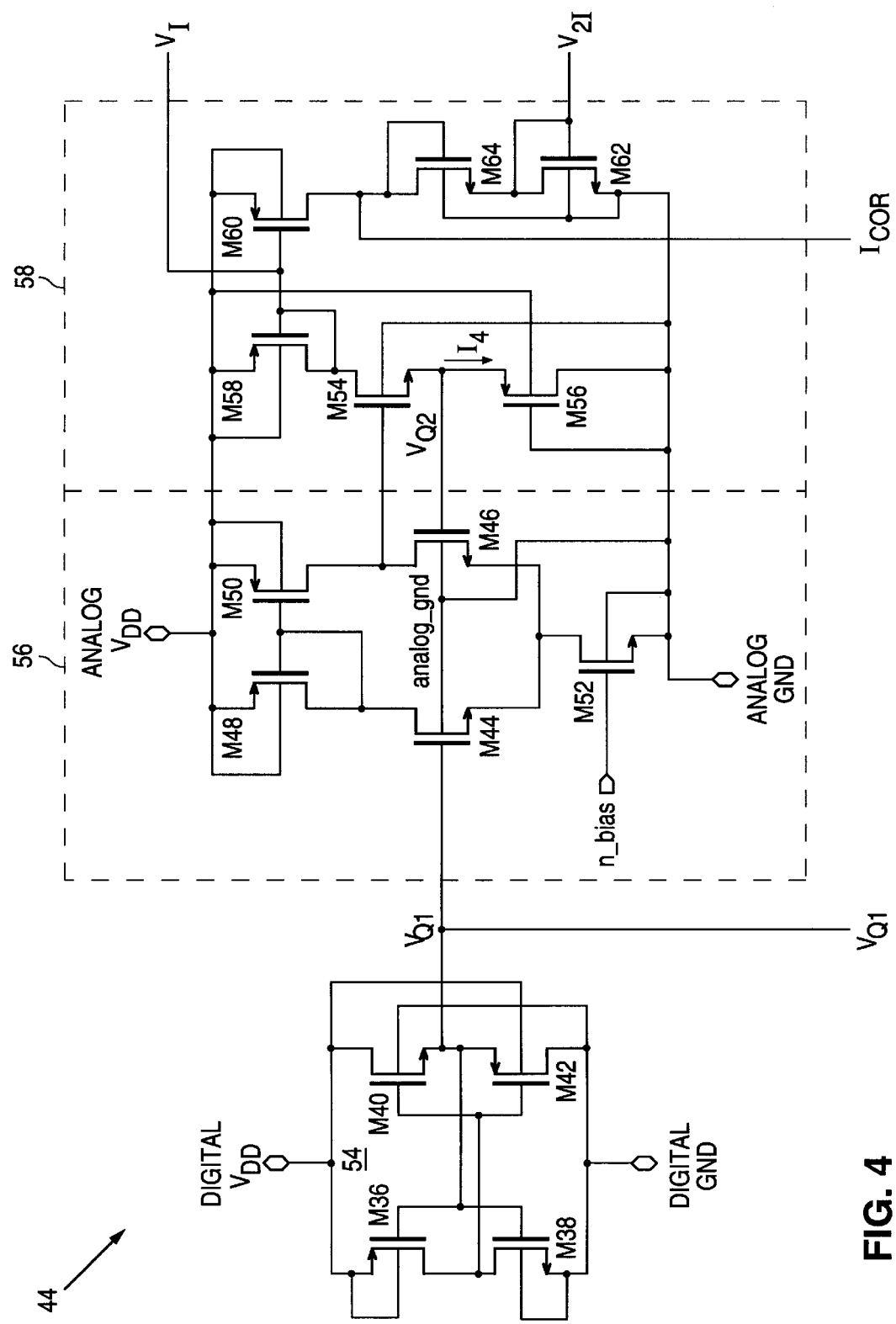
FIG. 4 is a schematic diagram illustrating the reference generation stage of the voltage comparator shown in FIG. 2.
Figure 5:
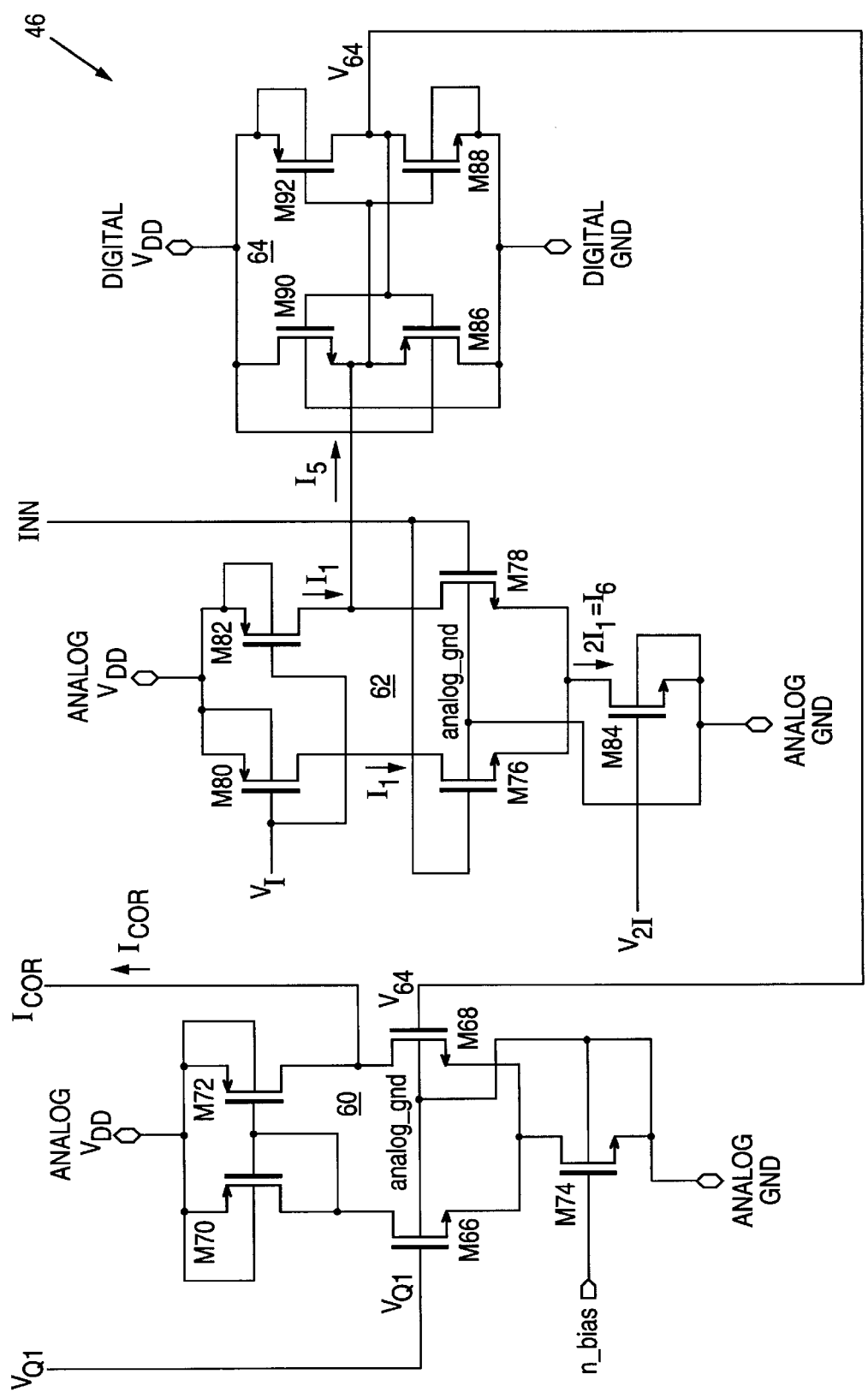
FIG. 5 is a schematic diagram illustrating the correcting stage of the voltage comparator shown in FIG. 2.

The following are example channel sizes for the transistors shown in FIG. 3. It should be understood that the channel sizes recited herein for FIGS. 3, 4, 5 are examples only and that any number of the channel sizes may be changed in accordance with the present invention to suit the particular requirements of a particular application. Specifically, transistors M14, M16 may each have a channel width of 50 μm and a channel length of 1 μm, transistors M10, M12 may each have a channel width of 40 μm and a channel length of 1.5 μm, transistor M18 may have a channel width of 40 μm and a channel length of 1 μm, transistors M22, M24, M30, M32 may each have a channel width of 12.5 μm and a channel length of 1 μm, and transistors M20, M26, M28, M34 may each have a channel width of 5 μm and a channel length of 1 μm.

Figure 1A:
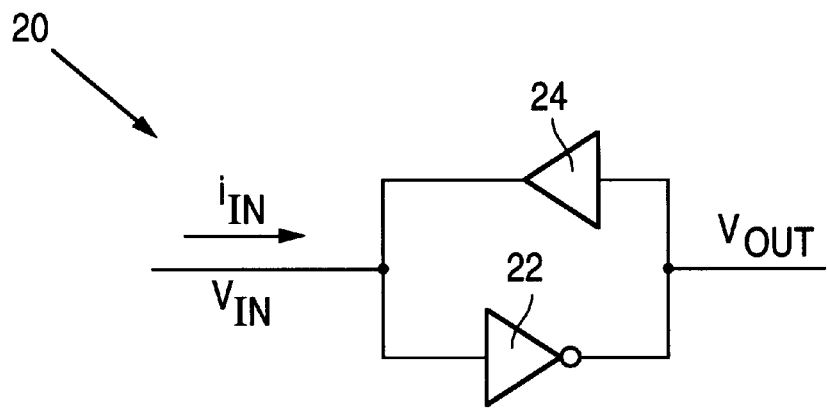
FIGS. 1A and 1B are schematic diagrams illustrating a conventional current difference amplifier.
Figure 1B:
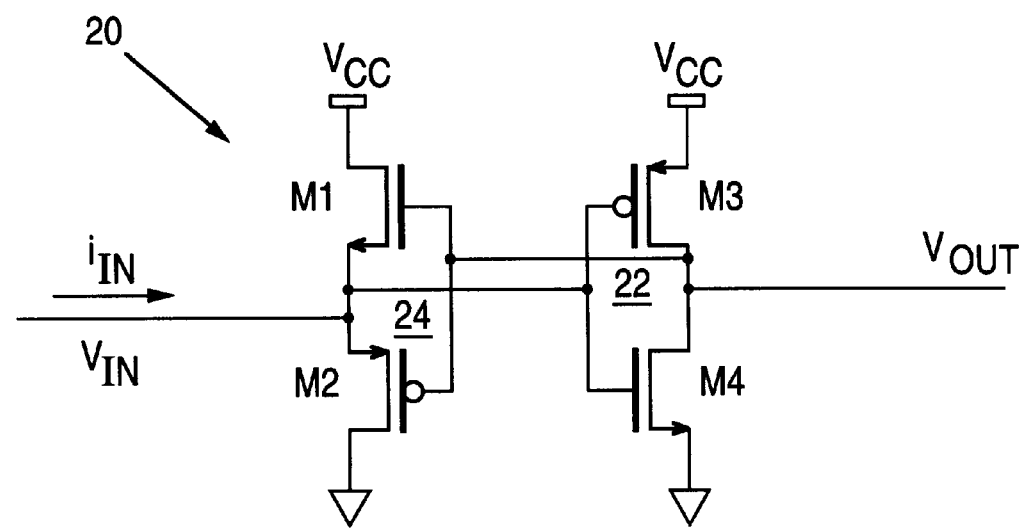
Figure 1C:
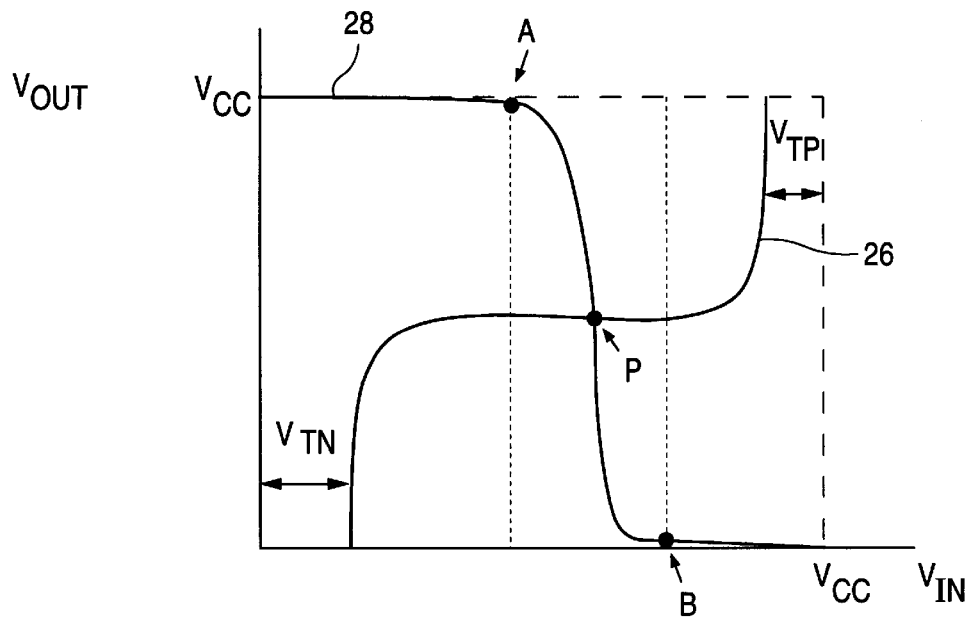
FIG. 1C is a plot illustrating transfer functions for the current difference amplifier shown in FIGS. 1A and 1B.

Referring to FIG. 4, the reference generation stage 44, which generates the reference voltages $V_I$ and $V_{2I}$, includes a difference amplifier 54, a comparator 56, and an output stage 58, all connected substantially as shown. As mentioned above, the reference voltage $V_1$ causes the current $I_1$ to be conducted by each of the transistors M14, M16, and the reference voltage $V_{2I}$ causes the current $2I_I$ to be conducted by transistor M18. The strength of current $I_1$ is chosen so that when it is sourced into the difference amplifiers 50, 52 via currents $I_2$, $I_3$, respectively, it is just enough current to move the operating point of the difference amplifiers 50, 52 to either point A or point B on the transfer function 28 shown in FIG. 1C. Any greater amount of current would not be necessary for full output voltage swing.

Therefore, the magnitude of reference voltage $V_I$ is set so that just the right amount of current $I_1$ is generated. Similarly, the magnitude of the reference voltage $V_{2I}$ is set so that the current $2I_1$ conducted by transistor M18 is exactly twice the current $I_1$.

In order to generate the reference (bias) voltage $V_I$ for the proper current $I_1$, the difference amplifier 54 is configured to generate the zero input current quiescent voltage level $V_Q$ at the sources of transistors M40, M42. The quiescent voltage level $V_Q$ is generated because the input current of difference amplifier 54 is zero. The quiescent voltage level $V_Q$ is the same level that is generated by difference amplifiers 50, 52 when the currents $I_2$, $I_3$, respectively, are zero.

The quiescent voltage level $V_Q$ is provided to the gate of transistor M44 of the comparator 56. The comparator 56 functions as an operational amplifier having a negative feedback loop provided by the connections between transistors M46, M54. Because of this negative feedback, the quiescent voltage level $V_Q$ is provided to the source of p-channel transistor M56 of the output stage 58.

Transistor M56 is matched with p-channel transistors M22, M30 of difference amplifiers 50, 52, respectively. Transistor M56 has its gate coupled to ground in order to mimic the operation of transistors M22, M30 when they are receiving the sourcing currents $I_2$, $I_3$, respectively. Furthermore, because the quiescent voltage level $V_Q$ is present at the source of transistor M56, the current $I_4$ that is conducted by transistor M56 approximates that required to produce a full rail-to-rail swing in the output voltages OUT and OUT_L of difference amplifiers 50, 52. The current $I_4$ is reflected to generate bias for transistors M14, M16 of the comparator 48 via transistor M58 and $V_I$. Normally, the channel size of transistor M58 is chosen such that current $I_1$ is overdriven so that it is greater than current $I_4$. For example, current $I_1$ may be 1.3 to 2.0 times as great as current $I_4$.

The current $I_4$ is reflected to generate bias for transistor M18 of the comparator 48 via transistors M60, M62 and $V_{2I}$. The sizes of the channels of transistors M60, M62 are chosen so that the current conducted by transistor M18 is exactly twice that of current $I_1$.

The following are example channel sizes for the transistors shown in FIG. 4. Specifically, transistors M36, M42 may each have a channel width of 12.5 μm and a channel length of 1 μm, transistors M38, M40 may each have a channel width of 5 μm and a channel length of 1 μm, transistors M48, M50 may each have a channel width of 80 μm and a channel length of 1 μm, transistors M44, M46 may each have a channel width of 80 μm and a channel length of 1.5 μm, transistor M52 may have a channel width of 30 μm and a channel length of 2 μm, transistor M54 may have a channel width of 100 μm and a channel length of 1 μm, transistor M56 may have a channel width of 12.5 μm and a channel length of 1 μm, transistor M58 may have a channel width of 25 μm and a channel length of 1 μm, transistor M60 may have a channel width of 50 μm and a channel length of 1 μm, transistor M62 may have a channel width of 20 μm and a channel length of 1 μm, and transistor M64 may have a channel width of 100 μm and a channel length of 1 μm.

The reference generation stage 44 generates values for the reference voltages $V_I$, $V_{2I}$ so that the value of the current $I_6$ is approximately equal to twice the value of the current $I_1$. The correcting stage 46 fine tunes the values of the reference voltages $V_I$, $V_{2I}$ so that the current $I_6$ is exactly equal to twice the value of the current $I_1$, i.e., $I_6=2I_1$. Referring to FIG. 5, the correcting stage 46 includes two comparators 60, 62 and a difference amplifier 64. The comparator 62 matches the comparator 48. Reference voltage $V_I$ is applied to the gates of transistors M80, M82, reference voltage $V_{2I}$ is applied to the gate of transistor M84, and the gates of transistors M76, M78 are coupled to the same potential INN. It should be understood that the gates of transistors M76, M78 may alternatively be coupled to INP or some other potential.

Because the inputs of the comparator 62, i.e., the gates of transistors M76, M78, are equal, the offset current $I_5$ should be zero if the current $I_6$ conducted by transistor M84 is exactly equal to twice the current $I_1$, i.e., $2I_1$. The offset current $I_5$ drives the difference amplifier 64 which is matched with the difference amplifiers 50, 52. If the current $I_6$ is exactly equal to $2I_1$, then the output voltage $V_{64}$ of difference amplifier 64 will be equal to the quiescent voltage $V_Q$. If the current $I_6$ is not exactly equal to $2I_1$, then the offset current $I_5$ will not be zero and will either be sourcing to or sinking from the difference amplifier 64. Such a sourcing or sinking offset current $I_5$ into the difference amplifier 64 will cause its operating point to go to either point B or point A on the transfer function 28 shown in FIG. 1C, thus causing the output voltage $V_{64}$ to go either low or high, respectively.

The output voltage $V_{64}$ of difference amplifier 64 is provided to one input, i.e., the gate of transistor M68, of the comparator 60. The other input, i.e., the gate of transistor M66, of the comparator 60 receives the quiescent voltage $V_{Q1}$ which is generated by difference amplifier 54. If the offset current $I_5$ is equal to zero so that the output voltage $V_{64}$ of difference amplifier 64 is equal to the quiescent voltage $V_Q$, then the correcting current $I_{COR}$ of comparator 60 is equal to zero because the input voltages $V_{Q1}$, $V_{64}$ are equal.

However, if the offset current $I_5$ is not equal to zero so that the output voltage $V_{64}$ of difference amplifier 64 is either high or low, then the correcting current $I_{COR}$ of comparator 60 is not equal to zero because the input voltages $V_{Q1}$, $V_{64}$ are not equal. In this scenario the correcting current $I_{COR}$ will provide either a sourcing or sinking current to the drain of transistor M64 of the output stage 58. This feedback loop will adjust the voltage $V_{2I}$ so that the current $I_6$ conducted by transistors M18, M84 is exactly equal to twice the current $I_1$, i.e., $2I_1$. When the current $I_6$ is exactly equal to $2I_1$, the offset current $I_5$ will go close to zero, causing the correcting current $I_{COR}$ to also go close to zero. It should be noted that the comparator 60 of the correcting stage 46 has a finite gain. The higher the gain of the comparator 60, the closer the correcting current $I_{COR}$ will go to zero. The correcting current $I_{COR}$ will go all the way to zero if the gain of the comparator 60 is infinite.

The following are example channel sizes for the transistors shown in FIG. 5. Specifically, transistors M70, M72 may each have a channel width of 80 μm and a channel length of 1 μm, transistors M66, M68 may each have a channel width of 80 μm and a channel length of 1.5 m, transistor M74 may have a channel width of 30 μm and a channel length of 2 μm, transistors M80, M82 may each have a channel width of 50 μm and a channel length of 1 μm, transistors M76, M78 may each have a channel width of 40 μm and a channel length of 1.5 μm, transistor M84 may have a channel width of 40 μm and a channel length of 1 μm, transistors M86, M92 may each have a channel width of 12.5 μm and a channel length of 1 μm, and transistors M88, M90 may each have a channel width of 5 μm and a channel length of 1 μm.

Therefore, the reference generation stage 44 generates the reference voltages $V_I$, $V_{2I}$ which approximate the values of currents $I_1$, $I_6$, respectively. The correcting stage 46 uses feedback to fine tune the values of currents $I_1$, $I_6$. Specifically, the feedback provided by the correcting current $I_{COR}$ adjusts the reference voltage $V_{2I}$ so that current $I_6$ is exactly equal to $2I_1$.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A voltage comparator, comprising:
   an input comparator that compares a first input voltage to a second input voltage and which generates an output current in response thereto, wherein the output current is a sourcing current when the first input voltage is greater than the second input voltage, a zero current when the first input voltage is equal to the second input voltage, and a sinking current when the first input voltage is less than the second input voltage;
   a current difference amplifier coupled to the input comparator that generates a first output voltage level in response to the output current being a sourcing current, a second output voltage level in response to the output current being a zero current, and a third output voltage level in response to the output current being a sinking current;
   wherein the input comparator includes,
       first and second conduction paths in each of which a first current is generated in response to a first reference voltage;
       an output conduction path, coupled between the first conduction path and the first current difference amplifier, through which the output current flows; and
       a third conduction path coupled to the first and second conduction paths and in which a second current is generated in response to a second reference voltage;
   a reference generation circuit coupled to the input comparator that receives a correction current and in response thereto generates the first and second reference voltages having magnitudes which set the second current equal to twice the first current; and
   a feedback correction circuit coupled to the reference generation circuit that monitors the first and second reference voltages and which generates and provides the correction current to the reference generation circuit which adjusts the magnitudes of the first and second reference voltages to continually maintain the second current equal to twice the first current.

2. A voltage comparator for comparing a first input voltage to a second input voltage, comprising:
   an input comparator having first and second parallel conduction paths which are coupled to first and second nodes, respectively, and a common third conduction path which is coupled to the first and second parallel conduction paths, wherein in response to a first reference voltage the input comparator provides each of the first and second nodes with a first current, maintains in the third conduction path in response to a second reference voltage a sum of a second current conducted by the first conduction path and a third current conducted by the second conduction path which is equal to a fourth current, and in response to the first and second input voltages not being equal generates an output current to maintain the sum equal to the fourth current;
   a reference generation circuit coupled to the input comparator that receives a correction current and in response thereto generates the first and second reference voltages having magnitudes which set the fourth current equal to twice the first current;
   a first current difference amplifier having an input coupled to the input comparator and that generates one of a first, second and third output voltage levels in response to the output current being a sourcing, zero or sinking current, respectively; and
   a feedback correction circuit coupled to the reference generation circuit that monitors the first and second reference voltages and which generates and provides the correction current to the reference generation circuit to adjust the magnitudes of the first and second reference voltages to continually maintain the second current equal to twice the first current.

3. A voltage comparator for comparing a first input voltage to a second input voltage, comprising:
   a first transistor having a gate to which the first input voltage is applied;
   a second transistor having a gate to which the second input voltage is applied;
   a first current source coupled to the first and second transistors that provides a first current to each of a first node connected to the first transistor and a second node connected to the second transistor in response to a first reference voltage;
   a second current source coupled to the first and second transistors that conducts a second current in response to a second reference voltage, the second current being equal to a sum of a third current conducted by the first transistor and a fourth current conducted by the second transistor;

a reference generation circuit coupled to the first and second current sources that receives a correction current and in response thereto generates the first and second reference voltages to each have a magnitude which sets the second current equal to twice the first current;

a first current difference amplifier having an input coupled to the first transistor and that generates one of a first, second and third output voltage levels in response to a sourcing, zero or sinking current, respectively, being received at its input; and a feedback correction circuit coupled to the reference generation circuit that monitors the first and second reference voltages and which generates and provides the correction current to the reference generation circuit to adjust the magnitudes of the first and second reference voltages to continually maintain the second current equal to twice the first current.

4. A voltage comparator for comparing a first input voltage to a second input voltage, comprising:

a first transistor having a gate to which the first input voltage is applied;

a second transistor having a gate to which the second input voltage is applied;

third and fourth transistors, coupled to the first and second transistors respectively, which each conduct a first current in response to a first reference voltage being applied to a gate of each transistor;

a fifth transistor coupled to the first and second transistors and having a gate to which a second reference voltage is applied to conduct a second current in the fifth transistor, the second current being equal to a sum of a third current conducted by the first transistor and a fourth current conducted by the second transistor;

a reference generation circuit coupled to the third, fourth and fifth transistors that generates the first and second reference voltages having magnitudes which set the second current equal to twice the first current, wherein the reference generation circuit includes a first p-channel transistor having a gate coupled to a ground node and a current mirror circuit coupled to the first p-channel transistor which generates the first and second reference voltages, and the non-inverting amplifier includes a first n-channel transistor and a second p-channel transistor with the second p-channel transistor being matched to the first p-channel transistor;

a first current difference amplifier having an input coupled to the first and third transistors that generates one of a first, second and third output voltage levels in response to a sourcing, zero or sinking current, respectively, being received at its input, wherein the first current difference amplifier includes an inverting amplifier having an input and an output, and a non-inverting amplifier having an input and an output, the output of the non-inverting amplifier being coupled to the input of the inverting amplifier and the input of the non-inverting amplifier being coupled to the output of the inverting amplifier, wherein the input of the inverting amplifier forms the input of the first current difference amplifier; and a feedback correction circuit coupled to the reference generation circuit that monitors the first and second reference voltages and which generates and provides the correction current to the current mirror circuit which adjusts the magnitudes of the first and second reference voltages to continually maintain the second current equal to twice the first current.

5. A voltage comparator for comparing a first input voltage to a second input voltage, comprising:

an input comparator having first and second transistors which are coupled to first and second nodes, respectively, and a third transistor which is coupled to the first and second transistors, wherein in response to a first reference voltage the input comparator provides each of the first and second nodes with a first current and maintains in the third transistor in response to a second reference voltage a sum of a second current conducted by the first transistor and a third current conducted by the second transistor which is equal to a fourth current, wherein in response to the first and second input voltages not being equal the input comparator generates an output current to maintain the sum equal to the fourth current;

a reference generation circuit coupled to the input comparator that receives a correction current and in response thereto generates the first and second reference voltages having magnitudes which set the fourth current approximately equal to twice the first current;

a first current difference amplifier having an input coupled to the input comparator that generates one of a first, second and third output voltage levels in response to the output current being a sourcing, zero or sinking current, respectively; and a feedback correction circuit coupled to the reference generation circuit that monitors the first and second reference voltages and generates and provides the correction current to the reference generation circuit which adjusts the magnitudes of the first and second reference voltages to continually maintain the second current equal to twice the first current.

6. A voltage comparator in accordance with claim 5, wherein the feedback correction circuit comprises:

a first comparator which receives the first and second input voltages and which when the first and second input voltages are equal generates an output current in response to the first and second reference voltages not having magnitudes which set the second current equal to twice the first current;

a second current difference amplifier having an input coupled to the input comparator and that generates one of a first, second and third output voltage levels in response to the output current of the first comparator being a sourcing, zero or sinking current, respectively; and a second comparator coupled to the second current difference amplifier which generates the correction current in response to a comparison of the output voltage of the second current difference amplifier and a third reference voltage.

* * * * *